(12) United States Patent
Choi

(10) Patent No.: US 12,543,467 B2
(45) Date of Patent: Feb. 3, 2026

(54) DISPLAY DEVICE

(71) Applicant: Samsung Display Co., LTD., Yongin-si (KR)

(72) Inventor: Hak Bum Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 671 days.

(21) Appl. No.: 17/877,384

(22) Filed: Jul. 29, 2022

(65) Prior Publication Data

US 2023/0180571 A1    Jun. 8, 2023

(30) Foreign Application Priority Data

Dec. 6, 2021    (KR) .......................... 10-2021-0172894

(51) Int. Cl.
| | |
|---|---|
| *H01L 23/00* | (2006.01) |
| *H10K 50/86* | (2023.01) |
| *H10K 59/38* | (2023.01) |
| *H10K 59/122* | (2023.01) |

(52) U.S. Cl.
CPC ............ *H10K 59/38* (2023.02); *H10K 50/86* (2023.02); *H10K 59/122* (2023.02)

(58) Field of Classification Search
CPC .. H10D 30/6211; H10D 64/01; H10D 64/017; H10D 64/517; H10D 64/667; H10D 84/0158; H10D 84/038; H10D 84/834; H10D 30/62; H10D 30/024; H10D 64/513; H10D 30/0243; H10D 30/6215
See application file for complete search history.

(56) References Cited

U.S. PATENT DOCUMENTS

| | | | |
|---|---|---|---|
| 2015/0340655 | A1 | 11/2015 | Lee et al. |
| 2018/0275461 | A1* | 9/2018 | Park ................... G02F 1/133621 |
| 2020/0066802 | A1* | 2/2020 | Lee ..................... H10K 50/8426 |
| 2020/0219938 | A1 | 7/2020 | Ahn et al. |
| 2020/0257162 | A1* | 8/2020 | Lee ......................... H10K 50/844 |
| 2022/0393135 | A1 | 12/2022 | Choi et al. |

(Continued)

FOREIGN PATENT DOCUMENTS

| | | |
|---|---|---|
| JP | 2020-173332 A | 10/2020 |
| KR | 10-2014-0085087 A | 7/2014 |
| KR | 20170123600 A * | 11/2017 |

(Continued)

*Primary Examiner* — Samuel Park
(74) *Attorney, Agent, or Firm* — Womble Bond Dickinson (US) LLP

(57) ABSTRACT

A display device includes: a display panel and a color converting panel facing each other and having a display area and a peripheral area; and a sealing member therebetween and disposed on an external edge of the peripheral area. The display panel includes a first substrate, light-emitting devices the first substrate, and an encapsulation layer on the light-emitting devices and in the display area and the peripheral area. The color converting panel includes a second substrate, a first color filter, a second color filter, and a third color filter on the second substrate and in the display area and the peripheral area, and a partition wall and a dummy partition wall on the first-third color filters. At least one of the first color filter, the second color filter, and the third color filter has an opening in the peripheral area, and the dummy partition wall overlaps the opening.

19 Claims, 7 Drawing Sheets

(56) References Cited

U.S. PATENT DOCUMENTS

2024/0260379 A1   8/2024   Yang et al.

FOREIGN PATENT DOCUMENTS

| | | |
|---|---|---|
| KR | 10-2019-0090101 A | 8/2019 |
| KR | 10-2020-0086774 A | 7/2020 |
| KR | 10-2020-0113077 A | 10/2020 |
| KR | 10-2021-0024345 A | 3/2021 |
| KR | 10-2021-0127279 A | 10/2021 |
| KR | 10-2022-0165874 A | 12/2022 |

* cited by examiner

DISPLAY DEVICE

CROSS-REFERENCE TO RELATED APPLICATION

This application claims priority to and the benefit of Korean Patent Application No. 10-2021-0172894, filed in the Korean Intellectual Property Office on Dec. 6, 2021, the entire content of which is incorporated herein by reference.

BACKGROUND

1. Field

Aspects of embodiments of the present disclosure relate to a display device.

2. Description of the Related Art

A display device is a device for displaying images on a screen, and it may be, as some examples, a liquid crystal display (LCD) or an organic light emitting diode display (OLED). The display device is used in various electronic devices, such as portable phones, GPS, digital cameras, electronic books, portable game devices, and various terminals.

An organic light emitting device includes two electrodes and an organic emission layer disposed therebetween. Electrons injected from one electrode are combined with holes injected from the other electrode in the organic emission layer to form excitons. The excitons transit to a ground state from an excited state to output energy and emit light.

Recently, display devices further including a color converting panel to reduce an optical loss and providing the display device with high color reproducibility have been proposed. The color converting panel may include semiconductor nanocrystals, such as quantum dots, and may convert incident light into different colors.

When the color converting panel is bonded to the substrate on which light-emitting devices are formed, a portion may be pressed (or compressed). Accordingly, a region may be broken or torn, which influences the screen displaying region, and hence, defects, such as deterioration of luminance, may be generated.

The above information disclosed in this Background section is for enhancement of understanding of the background of the described technology, and therefore, it may contain information that does not form prior art that is already known to a person of ordinary skill in the art.

SUMMARY

The present disclosure prevents or reduces defects in a display device, such as luminance deterioration, by preventing pressing in a process for bonding respective substrates.

A display device, according to an embodiment of the present disclosure, includes: a display panel and a color converting panel facing each other and having a display area and a peripheral area; and a sealing member between the display panel and the color converting panel, the sealing member being at an external edge of the peripheral area. The display panel includes: a first substrate; a plurality of light-emitting devices on one side of the first substrate; and an encapsulation layer on the light-emitting devices and in the display area and the peripheral area. The color converting panel includes: a second substrate; a first color filter, a second color filter, and a third color filter on one side of the second substrate and in the display area and the peripheral area; and a partition wall and a dummy partition wall on the first color filter, the second color filter, and the third color filter. At least one of the first color filter, the second color filter, and the third color filter has an opening in the peripheral area, and the dummy partition wall overlaps the opening.

The partition wall may be in the display area, and the dummy partition wall may be in the peripheral area.

The partition wall may overlap the first color filter, the second color filter, and the third color filter in the display area, and the dummy partition wall may overlap the first color filter, the second color filter, and the third color filter in the peripheral area.

The opening may include: a first opening in the first color filter; a second opening in the second color filter; and a third opening in the third color filter.

The first opening, the second opening, and the third opening may have different widths from each other.

At least a portion of each of the first opening, the second opening, and the third opening may overlap each other.

The first color filter, the second color filter, and the third color filter may have a stair shape in the opening.

The opening may include: a second opening in the second color filter; and a third opening in the third color filter, and an opening may not be in the first color filter in the peripheral area.

The opening may be in the third color filter, and an opening may not be in the first color filter and the second color filter in the peripheral area.

A height of a portion of the dummy partition wall overlapping the opening may be less than a height of a portion of the dummy partition wall offset from the opening.

A height of a portion of the dummy partition wall nearer to the sealing member may be less than a height of a portion of the dummy partition wall nearer to the display area.

The display device may further include a spacer on the partition wall.

The display device of may further include a dummy spacer on the dummy partition wall.

The dummy spacer may include a light blocking material and may overlap the opening.

The display device may further include a first color converting layer, a second color converting layer, and a transmitting layer surrounded by the partition wall in a plan view and in the display area. The first color converting layer may overlap the first color filter, the second color converting layer may overlap the second color filter, and the transmitting layer may overlap the third color filter.

The dummy partition wall may be in the opening.

The dummy partition wall may fill the opening.

A color converting panel, according to an embodiment of the present disclosure, includes: a second substrate having a display area and a peripheral area; a first color filter, a second color filter, and a third color filter on one side of the second substrate; and a partition wall on the first color filter, the second color filter, and the third color filter. At least one of the first color filter, the second color filter, and the third color filter has an external opening in the peripheral area, and the partition wall is depressed in the external opening.

The first color filter, the second color filter, and the third color filter may be patterned, and the first color filter, the second color filter, and the third color filter may not overlap each other in the display area.

The color converting panel may further include a color converting layer overlapping non-overlapping portions of the first color filter, the second color filter, and the third color filter and may be between the partition wall.

According to embodiments of the present disclosure, no pressing is generated in the process for bonding respective substrates of the display device, thereby preventing deterioration of luminance.

DETAILED DESCRIPTION

Figure 1:
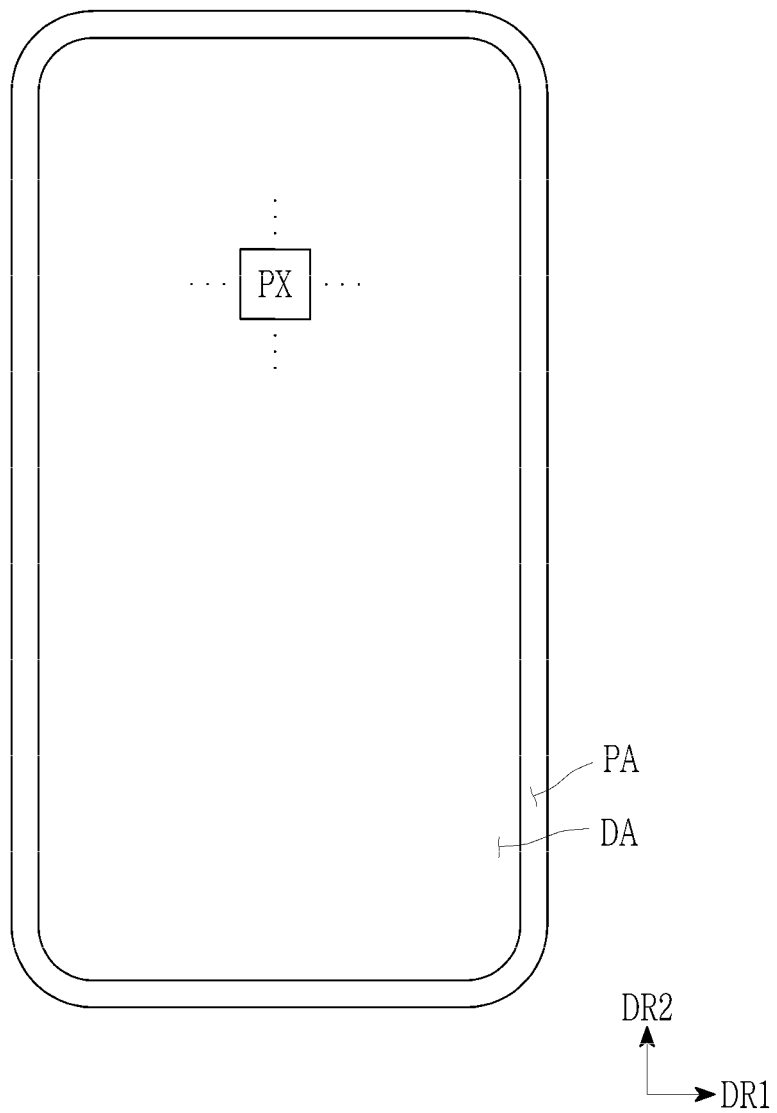
FIG. 1 shows a top plan view of a display device according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

Aspects and features of the present disclosure that are irrelevant to the description may be omitted to more clearly describe the present disclosure, and the same elements will be designated by the same reference numerals throughout the specification.

The size and thickness of elements and layers shown in the drawings may be arbitrarily shown for better understanding and ease of description; thus, the present disclosure is not limited thereto. In other words, in the drawings, the thickness of layers, films, panels, regions, etc., may be enlarged for clarity, and the thicknesses of some layers and areas may be exaggerated for convenience of explanation.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

The phrase "on a plane" means viewing the object portion from the top, and the phrase "on a cross-section" means viewing a cross-section of which the object portion is vertically cut from the side.

A display device according to an embodiment will now be described with reference to FIG. 1 to FIG. 4.

Figure 2:
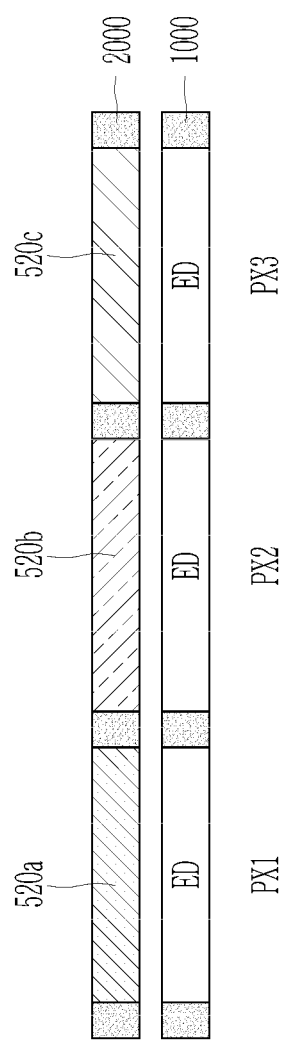
FIG. 2 shows a cross-sectional view of a display device according to an embodiment.
Figure 3:
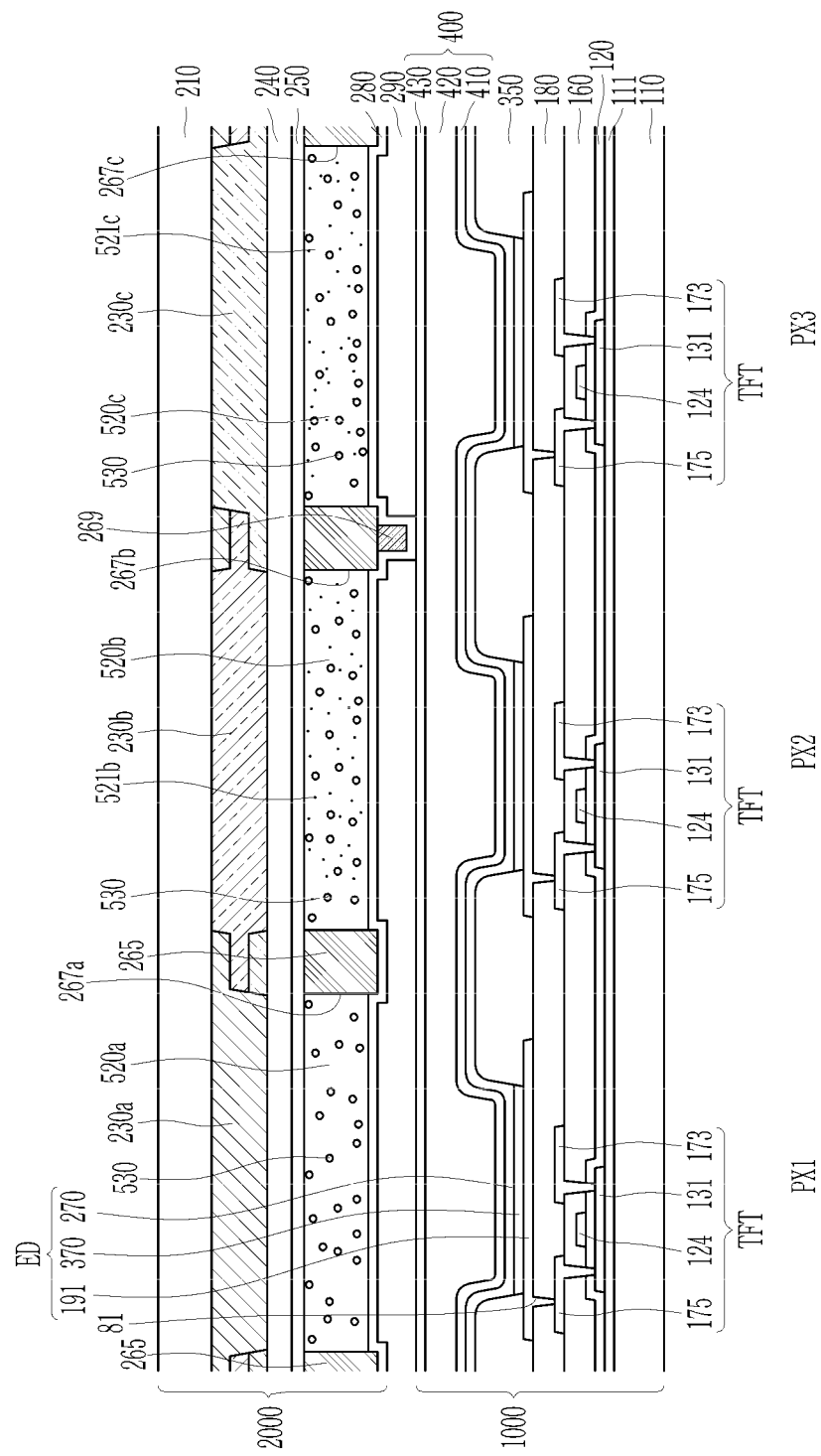
FIG. 3 shows a cross-sectional view of a display area of a display device according to an embodiment.
Figure 4:
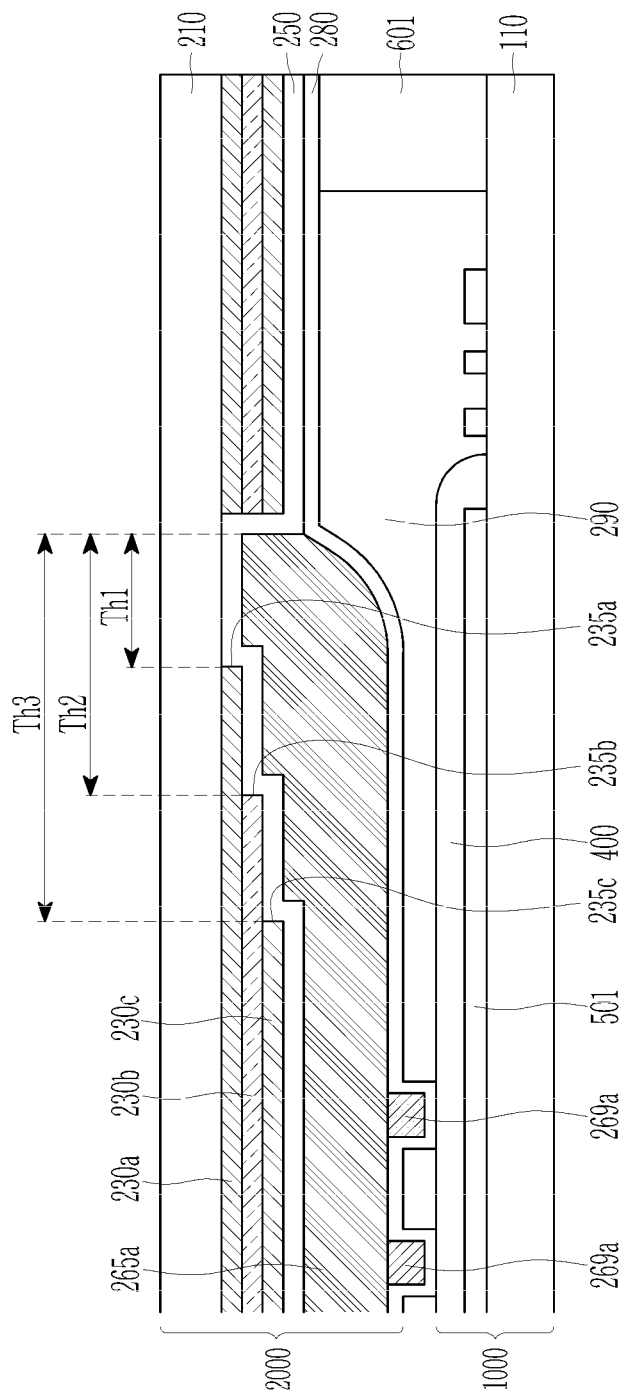
FIG. 4 shows a cross-sectional view of a peripheral area of a display device according to an embodiment.

FIG. 1 shows a top plan view of a display device according to an embodiment, FIG. 2 shows a cross-sectional view of a display device according to an embodiment, FIG. 3 shows a cross-sectional view of a display area of a display device according to an embodiment, and FIG. 4 shows a cross-sectional view of a peripheral area of a display device according to an embodiment.

As shown in FIG. 1, the display device may have a display area DA and a peripheral area PA.

A plurality of pixels PX may be positioned in the display area DA. The pixels PX may be disposed as a matrix and may receive image signals to display images. The pixels PX may be variously disposed (or arranged). The display device may further include a plurality of signal lines. The signal lines may include a plurality of scan lines, a plurality of light emitting control lines, a plurality of data lines, a plurality of first initialization voltage lines, a plurality of second initialization voltage lines, and a plurality of driving voltage lines. The signal lines may respectively transmit scan signals, light emitting control signals, data signals, first initialization voltages, second initialization voltages, and driving voltages. The signal lines may be positioned traverse each other in a first direction DR1 or a second direction DR2. The first direction DR1 may be a row direction, and the second direction DR2 may be a column direction. The pixels PX may respectively include a plurality of transistors, capacitors, and at least one light emitting diode (LED) connected to a plurality of the signal lines.

The display device according to an embodiment may be (or may be configured as) an organic light emitting device. The type of the display device is not limited thereto, however, and the display device may be configured as any of various types of display devices. For example, the display device may be formed with a liquid crystal display, an electrophoretic display, and an electrowetting display device. The display device may also be formed with next-generation display devices, such as a micro light emitting diode (LED) (Micro LED) display device, a quantum dot light emitting diode (QLED) display device, or a quantum dot organic light emitting diode (QD-OLED) display device.

A voltage transmitting line for transmitting voltages to a plurality of signal lines may be positioned in the peripheral area PA. The voltage transmitting line may be formed to surround (e.g., to extend around a periphery of) the display area DA. The voltage transmitting line may include a first initialization voltage transmitting line, a second initialization voltage transmitting line, and a driving voltage transmitting line. A driver for supplying voltages to a plurality of signal lines may be positioned in the peripheral area PA. The voltage transmitting line may be connected between the signal line and the driver.

As shown in FIG. 2, the display device according to an embodiment includes a display panel 1000 and a color converting panel 2000 overlapping the display panel 1000.

The display panel 1000 may include a plurality of first pixels PX1, a plurality of second pixels PX2, and a plurality of third pixels PX3, and the light-emitting devices ED may be respectively positioned on the first pixel PX1, second pixel PX2, and third pixel PX3. For example, the display panel 1000 may include a plurality of light-emitting devices ED. The respective light-emitting devices ED may emit light, and the display panel 1000 may adjust (e.g., may convert) the light emitted by the light-emitting devices ED of the first pixel PX1, the second pixel PX2, and the third pixel PX3 and may display an image. The light-emitting device ED may be an organic light emitting element, and the display panel 1000 may be an organic light emitting panel. The type of the display panel 1000 is not limited thereto, however, and may be various types of display panels. The display panel 1000 may be a flat and rigid display panel or may be a flexible display panel that may be smoothly bent.

The color converting panel 2000 may be disposed to face the display panel 1000. The color converting panel 2000 may include a transmitting layer 520a, a first color converting layer 520b, and a second color converting layer 520c. The transmitting layer 520a may overlap the light-emitting device ED positioned on the first pixel PX1. Light emitted from the light-emitting device ED of the first pixel PX1 may pass through the transmitting layer 520a and light with a first wavelength may be discharged. The first color converting layer 520b may overlap the light-emitting device ED positioned on the second pixel PX2. Light emitted from the light-emitting device ED of the second pixel PX2 may pass through the first color converting layer 520b and light with a second wavelength may be discharged. The second color converting layer 520c may overlap the light-emitting device ED positioned on the third pixel PX3. Light emitted from the light-emitting device ED of the third pixel PX3 may pass through the second color converting layer 520c and light with a third wavelength may be discharged. For example, light with a first wavelength may be blue light, light with a second wavelength may be red light, and light with a third wavelength may be green light. For example, the first pixel PX1, the second pixel PX2, and the third pixel PX3 may respectively be a blue pixel, a red pixel, and a green pixel. However, without being limited thereto, colors displayed by the first pixel PX1, the second pixel PX2, and the third pixel PX3 may be changed in various ways. Pixels for displaying other colors may be further included in addition to the first pixel PX1, the second pixel PX2, and the third pixel PX3.

As shown in FIG. 3, the display device includes the display panel 1000 and the color converting panel 2000. A filling layer 290 may be positioned between the display panel 1000 and the color converting panel 2000.

A stacking structure of the display area DA of the display panel 1000 of the display device according to an embodiment will now be described.

The display panel 1000 may include a first substrate 110, a semiconductor 131 positioned on one side of the first substrate 110, a transistor TFT including a gate electrode 124, a source electrode 173, and a drain electrode 175, a gate insulating layer 120, a first interlayer insulating layer 160, a second interlayer insulating layer 180, a pixel electrode 191, an emission layer 370, a pixel defining layer 350, a common electrode 270, and an encapsulation layer 400. The transistor TFT may be positioned on one side of the first substrate 110 of the display panel 1000 facing the second substrate 210 of the color converting panel 2000.

The first substrate 110 may include a rigid material, such as glass, or a flexible material, such as plastic or a polyimide, that may be bent. The first substrate 110 may be flexible, stretchable, foldable, bendable, or rollable.

A buffer layer 111 for smoothing (or planarizing) a surface of the first substrate 110 and for blocking permeation of impurities into the semiconductor 131 may be further positioned on the first substrate 110. The buffer layer 111 may include an inorganic material, for example, an inorganic insulating material, such as a silicon nitride ($SiN_x$), a silicon oxide ($SiO_x$), or a silicon oxynitride ($SiO_xN_y$). The buffer layer 111 may be a single-layered or multi-layered structure of the material. A barrier layer may be positioned on the first substrate 110. The barrier layer may be positioned between the first substrate 110 and the buffer layer 111. The barrier layer may include an inorganic insulating material, such as a silicon nitride ($SiN_x$), a silicon oxide ($SiO_x$), or a silicon oxynitride ($SiO_xN_y$). The barrier layer may be a single-layered or multi-layered structure of the material.

The semiconductor 131 may be positioned on the first substrate 110. The semiconductor 131 may include one of amorphous silicon, polycrystalline silicon, and an oxide semiconductor. For example, the semiconductor 131 may include a low temperature polycrystalline silicon (LTPS) or may include an oxide semiconductor material including at least one of zinc (Zn), indium (In), gallium (Ga), tin (Sn), and a mixture thereof. For example, the semiconductor 131 may include (or may be) indium-gallium-zinc oxide (IGZO). The semiconductor 131 may have a channel region, a source region, and a drain region distinguished by whether impurities are doped thereto. The source region and the drain region may have conductive characteristics corresponding to conductors.

The gate insulating layer 120 may cover the semiconductor 131 and the first substrate 110. The gate insulating layer 120 may include an inorganic insulating material, such as a silicon nitride ($SiN_x$), a silicon oxide ($SiO_x$), or a silicon oxynitride ($SiO_xN_y$). The gate insulating layer 120 may be a single-layered or multi-layered structure of the material.

The gate electrode 124 may be positioned on the gate insulating layer 120. The gate electrode 124 may include a metal, such as copper (Cu), molybdenum (Mo), aluminum (Al), silver (Ag), chromium (Cr), tantalum (Ta), or titanium (Ti), or a metal alloy thereof. The gate electrode 124 may be a single layer or a multilayer structure. A region of the semiconductor 131 overlapping the gate electrode 124 in a plan view may be a channel region.

The first interlayer insulating layer 160 may cover the gate electrode 124 and the gate insulating layer 120. The first interlayer insulating layer 160 may include an inorganic insulating material, such as a silicon nitride ($SiN_x$), a silicon oxide ($SiO_x$), or a silicon oxynitride ($SiO_xN_y$). The first interlayer insulating layer 160 may be a single-layered or multi-layered structure of the material.

The source electrode 173 and the drain electrode 175 may be positioned on the first interlayer insulating layer 160. The source electrode 173 and the drain electrode 175 are respectively connected to the source region and the drain region of the semiconductor 131 via openings formed in the first interlayer insulating layer 160 and the gate insulating layer 120. The above-described semiconductor 131, the gate electrode 124, the source electrode 173, and the drain electrode 175 together configure one transistor TFT. In some embodiments, the transistor TFT may omit the source electrode 173 and the drain electrode 175 but may include the source region and the drain region of the semiconductor 131. One transistor TFT is shown to be on the respective first pixel PX1, the second pixel PX2, and the third pixel PX3, but the present disclosure is not limited thereto. In some embodiments, a plurality of transistors TFT may be positioned on the first pixel PX1, the second pixel PX2, and the third pixel PX3.

The source electrode 173 and the drain electrode 175 may include a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may be a single layer or a multilayer structure. The source electrode 173 and the drain electrode 175 may be have a triple-layer structure including an upper layer, an intermediate layer, and a lower layer, and the upper layer and the lower layer may include titanium (Ti) and the intermediate layer may include aluminum (Al).

The second interlayer insulating layer 180 may be positioned on the source electrode 173 and the drain electrode 175. The second interlayer insulating layer 180 covers the source electrode 173, the drain electrode 175, and the first interlayer insulating layer 160. The second interlayer insulating layer 180 planarizes the surface of the first substrate 110 on which transistors TFT are arranged, it may be an organic insulator, and it may include at least one material of polyimide, polyamide, acryl resin, benzocyclobutene, and phenol resin.

The pixel electrode 191 may be positioned on the second interlayer insulating layer 180. The pixel electrode 191 may also be referred to as an anode, and it may be a single layer including a transparent conductive oxide film or a metal material or a multilayer including the same. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al)

The second interlayer insulating layer 180 may have a via hole (e.g., a via opening) 81 exposing the drain electrode 175. The drain electrode 175 and the pixel electrode 191 may be physically and electrically connected to each other through the via hole 81 in the second interlayer insulating layer 180. Accordingly, the pixel electrode 191 may receive an output current to be transmitted to the emission layer 370 from the drain electrode 175.

The pixel defining layer 350 may be positioned on the pixel electrode 191 and the second interlayer insulating layer 180. The pixel defining layer 350 includes a pixel opening 351 overlapping at least part of the pixel electrode 191. The pixel opening 351 may overlap a center portion of the pixel electrode 191 and may not overlap an edge of the pixel electrode 191. Therefore, the pixel opening 351 may be smaller than the pixel electrode 191. The pixel defining layer 350 may partition a formation position of the emission layer 370 so that the emission layer 370 may be positioned on a portion in which an upper side of the pixel electrode 191 is exposed. The pixel defining layer 350 may be positioned on a boundary between the first pixel PX1, the second pixel PX2, and the third pixel PX3. The pixel defining layer 350 may be an organic insulator including at least one material of polyimide, polyamide, acryl resin, benzocyclobutene, and phenol resin. In some embodiments, the pixel defining layer 350 may be formed with (or may include) a black pixel defining layer (BPDL) including a black color pigment.

A plurality of pixel openings 351 may respectively have a similar shape to the pixel electrode 191 in a plan view. For example, the pixel opening 351 and the pixel electrode 191 may have substantially polygonal shapes in a plan view. Corners of the pixel opening 351 and the pixel electrode 191 may be chamfered. The shapes of the pixel opening 351 and the pixel electrode 191 are not limited thereto and may be modifiable in many suitable ways.

In one embodiment, a plurality of pixel electrodes 191 corresponding to the respective first pixel PX1, second pixel PX2, and third pixel PX3 may have different sizes in a plan view. Similarly, a plurality of pixel openings 351 corresponding to the respective first pixel PX1, the second pixel PX2, and the third pixel PX3 may have different sizes in a plan view. For example, the pixel opening 351 and the pixel electrode 191 corresponding to the second pixel PX2 may have greater sizes than the pixel opening 351 and the pixel electrode 191 corresponding to the third pixel PX3 in a plan view. The pixel opening 351 and the pixel electrode 191 corresponding to the second pixel PX2 may have smaller or similar sizes than/to the pixel opening 351 and the pixel electrode 191 corresponding to the first pixel PX1 in a plan view. However, without being limited thereto, the respective pixel opening 351 and the pixel electrode 191 may have various sizes.

The emission layer 370 may be positioned in the pixel opening 351 partitioned by the pixel defining layer 350. However, without being limited thereto, the emission layer 370 may be positioned in the pixel opening 351 and also on the pixel defining layer 350. For example, the emission layer 370 may be entirely formed on the first substrate 110. The emission layer 370 may be formed by performing a deposition process by using an open mask, of which a portion corresponding to the display area DA is open. The emission layer 370 may include a low molecular or polymer organic material. The emission layer 370 is illustrated as a single layer but may include auxiliary layers, such as an electron injecting layer, an electron transport layer, a hole transport layer, and a hole injecting layer may be included above/below the emission layer 370. The hole injecting layer and the hole transport layer may be positioned on a lower portion of the emission layer 370, and the electron transport layer and the electron injecting layer may be positioned on an upper portion of the emission layer 370. Another emission layer may be further positioned on the emission layer 370. That is, at least two emission layers 370 may be stacked.

A spacer may be positioned on the pixel defining layer 350. The spacer may include a same material as the pixel defining layer 350. However, without being limited thereto, the spacer may be made of a material that is different from that of the pixel defining layer 350. The spacer may be an organic insulator including at least one material of polyimide, polyamide, acryl resin, benzocyclobutene, and phenol resin.

The common electrode 270 may be positioned on the pixel defining layer 350 and the emission layer 370. The common electrodes 270 of the first pixel PX1, the second pixel PX2, and the third pixel PX3 may be connected to (e.g., may be integral with) each other. The common electrodes 270 may be formed to be generally connected to each other on the first substrate 110. The common electrode 270 may also be referred to as a cathode and may be made of a transparent conductive layer including an indium tin oxide (ITO), an indium zinc oxide (IZO), an indium gallium zinc oxide (IGZO), and an indium tin zinc oxide (ITZO). The common electrode 270 may be made of a metal material, such as silver (Ag), magnesium (Mg), or a mixture thereof. A thickness of the common electrode 270 may be adjusted to be formed as a transparent conductive layer. The common electrodes 270 may have a semi-transparent characteristic and it may configure (or form) a microcavity with the pixel electrode 191.

The pixel electrode 191, the emission layer 370, and the common electrode 270 may together configure a light-emitting device ED. On the first pixel PX1, the second pixel PX2, and the third pixel PX3, portions overlapping the pixel electrode 191, the emission layer 370, and the common electrode 270 may become light emitting regions of the respective light-emitting devices ED.

The encapsulation layer 400 may be positioned on the common electrode 270. The encapsulation layer 400 may include at least one inorganic film and at least one organic film. The encapsulation layer 400 may include a first inorganic encapsulation layer 410, an organic encapsulation layer 420, and a second inorganic encapsulation layer 430. This is, however, an example, and the number of inorganic films and organic films configuring the encapsulation layer 400 are modifiable in many ways. For example, the encapsulation layer 400 may be stacked in order of the first inorganic encapsulation layer, the second inorganic encapsulation layer, the first organic encapsulation layer, and the third inorganic encapsulation layer. In another embodiment, the encapsulation layer 400 may be stacked in order of the first inorganic encapsulation layer, the first organic encapsulation layer, the second inorganic encapsulation layer, and the third inorganic encapsulation layer. The first inorganic encapsulation layer 410, the organic encapsulation layer 420, and the second inorganic encapsulation layer 430 may be positioned in part of the display area DA and the peripheral area PA. In other embodiments, the organic encapsulation layer 420 may be formed around the display area DA, and the first inorganic encapsulation layer 410 and the second inorganic encapsulation layer 430 may be formed up to the peripheral area PA. The encapsulation layer 400 protects the light-emitting device (ED) from moisture or oxygen that may intrude from the outside, and one of end portions of the first inorganic encapsulation layer 410 and the second inorganic encapsulation layer 430 may be formed to directly contact each other.

The encapsulation layer 400 may contact the filling layer 290. The second inorganic encapsulation layer 430 of the encapsulation layer 400 may contact the filling layer 290. However, this is an example, and another layer may be positioned between the encapsulation layer 400 and the filling layer 290.

The display device may further include a sensor for sensing touches. The sensor may include a plurality of sensing electrodes, and the sensor may be positioned between the display panel 1000 and the color converting panel 2000.

A stacking structure of the color converting panel 2000 in the display area DA of the display device according to an embodiment will now be described.

The color converting panel 2000 may include a second substrate 210, and a first color filter 230a, a second color filter 230b, and a third color filter 230c positioned on one side of the second substrate 210.

The second substrate 210 may include a rigid material, such as glass, or a flexible material, such as plastic or a polyimide, that may be bent. The second substrate 210 may be flexible, stretchable, foldable, bendable, or rollable.

The first color filter 230a may transmit light with a first wavelength and may absorb light with other wavelengths to increase purity of light with a first wavelength discharged to an outside of the display device.

The second color filter 230b may transmit light with a second wavelength and may absorb light with other wavelengths to increase purity of light with a second wavelength discharged to the outside of the display device.

The third color filter 230c may transmit light with a third wavelength and may absorb light with other wavelengths to increase purity of light with a third wavelength discharged to the outside of the display device.

The first color filter 230a, the second color filter 230b, and the third color filter 230c may respectively overlap the first pixel PX1, the second pixel PX2, and the third pixel PX3. The first color filter 230a, the second color filter 230b, and the third color filter 230c may overlap each other and may form a light blocking region on the boundary from among the first pixel PX1, the second pixel PX2, and the third pixel PX3. The first color filter 230a, the second color filter 230b, and the third color filter 230c are illustrated as overlapping each other in the light blocking region but are not limited thereto. For example, two of the first color filter 230a, the second color filter 230b, and the third color filter 230c may overlap each other and may form a light blocking region. For example, the first color filter 230a may overlap the second color filter 230b at the boundary between the first pixel PX1 and the second pixel PX2. The second color filter 230b may overlap the third color filter 230c at the boundary between the second pixel PX2 and the third pixel PX3. The third color filter 230c may overlap the first color filter 230a at the boundary between the third pixel PX3 and the first pixel PX1.

A low-refractive index layer 240 may be positioned on one side of each of the first color filter 230a, the second color filter 230b, and the third color filter 230c. For example, the low-refractive index layer 240 may be positioned between the first color filter 230a and the transmitting layer 520a, between the second color filter 230b and the first color converting layer 520b, and between the third color filter 230c and the second color converting layer 520c. The position of the low-refractive index layer 240 is not limited thereto and is modifiable in many ways. For example, the low-refractive index layer 240 may be positioned on the transmitting layer 520a, the first color converting layer 520b, and the second color converting layer 520c. In addition, the low-refractive index layer 240 may include a plurality of layers. Some layers may be positioned between the first color filter 230a and the transmitting layer 520a, between the second color filter 230b and the first color converting layer 520b, and between the third color filter 230c and the second color converting layer 520c, and the other layers may be positioned on the transmitting layer 520a, the first color converting layer 520b, and the second color converting layer 520c. The low-refractive index layer 240 may overlap the first color filter 230a, the second color filter 230b, and the third color filter 230c. For example, the low-refractive index layer 240 may be positioned in most of a region of the second substrate 210. The low-refractive index layer 240 may include an organic material or an inorganic material with a low refractive index. For example, the refractive index of the low-refractive index layer 240 may be equal to or greater than about 1.1 and equal to or less than about 1.3.

A first capping layer 250 may be positioned on one side of each of the first color filter 230a, the second color filter 230b, and the third color filter 230c. A low-refractive index layer 240 may be positioned between the color filters 230a, 230b, and 230c and the first capping layer 250. The first capping layer 250 may include an inorganic insulating material, such as a silicon nitride ($SiN_x$), a silicon oxide ($SiO_x$), or a silicon oxynitride ($SiO_xN_y$). The first capping layer 250 may be a single-layered or multi-layered structure of the material.

A partition wall 265 may be positioned on one side of the first capping layer 250. The partition wall 265 may have a first opening 267a overlapping the first color filter 230a, a second opening 267b overlapping the second color filter 230b, and a third opening 267c overlapping the third color filter 230c. The first opening 267a may overlap the light emitting region of the first pixel PX1, the second opening 267b may overlap the light emitting region of the second pixel PX2, and the third opening 267c may overlap the light emitting region of the third pixel PX3. The partition wall 265 may overlap the light blocking region where the first color filter 230a, the second color filter 230b, and the third color filter 230c overlap each other. Therefore, the partition wall 265 may overlap the boundary of the respective pixels PX1, PX2, and PX3. The partition wall 265 may overlap the pixel defining layer 350. The pixel defining layer 350 may overlap the light blocking region where the first color filter 230a, the second color filter 230b, and the third color filter 230c overlap each other.

A spacer 269 may be further positioned on the partition wall 265. The spacer 269 may include the same material as the partition wall 265. However, without being limited thereto, the spacer 269 may be made of a material that is different from that of the partition wall 265. The spacer 269 may include a light blocking material. For example, the spacer 269 may include a black pigment.

The transmitting layer 520a may be positioned in the first opening 267a, the first color converting layer 520b may be positioned in the second opening 267b, and the second color converting layer 520c may be positioned in the third opening 267c. The transmitting layer 520a, the first color converting layer 520b, and the second color converting layer 520c may be surrounded by (e.g., surrounded in a plan view by) the partition wall 265.

The transmitting layer 520a may overlap the first color filter 230a. The transmitting layer 520a may not overlap the second color filter 230b and the third color filter 230c. The transmitting layer 520a may transmit light input from (e.g., output or emitted by) the light-emitting device ED of the first pixel PX1. Light passing through the transmitting layer 520a may be light with a first wavelength. Light with a first wavelength emitted from the light-emitting device ED of the first pixel PX1 may sequentially pass through the transmitting layer 520a and the first color filter 230a and may be discharged to the outside. Light with a first wavelength may be blue light with a maximally emitted peak wavelength in a range of about 380 nm to about 480 nm, for example, equal to or greater than about 420 nm, equal to or greater than about 430 nm, equal to or greater than about 440 nm, or equal to or greater than about 445 nm, and equal to or less than about 470 nm, equal to or less than about 460 nm, or equal to or less than about 455 nm. The transmitting layer 520a may include a plurality of scatterers 530.

The first color converting layer 520b may overlap the second color filter 230b. The first color converting layer 520b may not overlap the first color filter 230a and the third color filter 230c. The first color converting layer 520b may convert the light input by the light-emitting device ED of the second pixel PX2 into light with a second wavelength. The light emitted by the light-emitting device ED of the second pixel PX2 may pass through the first color converting layer 520b, may be converted into light with a second wavelength, and may pass through the second color filter 230b to be discharged to the outside. The light with a second wavelength may be red light with the maximally emitted peak wavelength in a range of about 600 nm to about 650 nm, for example, about 620 nm to about 650 nm. The first color converting layer 520b may include a plurality of first quantum dots 521b and a plurality of scatterers 530.

The second color converting layer 520c may overlap the third color filter 230c. The second color converting layer 520c may not overlap the first color filter 230a and the second color filter 230b. The second color converting layer 520c may convert light input by the light-emitting device ED of the third pixel PX3 into light with a third wavelength. The light emitted by the light-emitting device ED of the third pixel PX3 may pass through the second color converting layer 520c, may be converted into light with a third wavelength, and may pass through the third color filter 230c to be discharged to the outside. The light with a third wavelength may be green light with the maximally emitted peak wavelength in a range of about 500 nm to about 550 nm, for example, about 510 nm to about 550 nm. The second color converting layer 520c may include a plurality of second quantum dots 521c and a plurality of scatterers 530.

The scatterers 530 may scatter the light that is input to the transmitting layer 520a, the first color converting layer 520b, and the second color converting layer 520c and may increase efficiency of light (e.g., may increase light extraction or emission efficiency).

The first quantum dots 521b and second quantum dots 521c (hereinafter, also referred to as semiconductor nanocrystals) may independently include a group II-VI compound, a group III-V compound, a group IV-VI compound, a group IV element or compound, a group I-III-VI compound, a group II-III-VI compound, a group I-II-IV-VI compound, or combinations thereof. The quantum dots may not include cadmium.

The group II-VI compound may be selected from a binary element compound selected from among CdSe, CdTe, ZnS, ZnSe, ZnTe, ZnO, HgS, HgSe, HgTe, MgSe, MgS, and a mixture thereof; a ternary element compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may further include a group III metal.

The group III-V compound may be selected from a binary element compound selected from among GaN, GaP, GaAs, GaSb, AlN, AlP, AlAs, AlSb, InN, InP, InAs, InSb, and a mixture thereof; a ternary element compound selected from among GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from among GaAlNP, GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal (e.g., InZnP).

The group IV-VI compound may be selected from a binary element compound selected from among SnS, SnSe, SnTe, PbS, PbSe, PbTe, and a mixture thereof; a ternary element compound selected from among SnSeS, SnSeTe, SnSTe, PbSeS, PbSeTe, PbSTe, SnPbS, SnPbSe, SnPbTe, and a mixture thereof; and a quaternary element compound selected from among SnPbSSe, SnPbSeTe, SnPbSTe, and a mixture thereof.

The group IV element or compound may be selected from a singular element material selected from among Si, Ge, and a mixture thereof; and a binary element compound selected from among SiC, SiGe, and a mixture thereof but is not limited thereto.

Examples of the group I-III-VI compound include $CuInSe_2$, $CuInS_2$, CuInGaSe, and CuInGaS but are not limited thereto. Examples of the group I-II-IV-VI compound include CuZnSnSe and CuZnSnS but are not limited thereto. The group IV element or compound may be a single element selected from among Si, Ge, and a mixture thereof, or a binary compound selected from among SiC, SiGe, and a mixture thereof.

The group II-III-VI compound may be selected from among ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof but are not limited thereto.

The group I-II-IV-VI compound may be selected from among CuZnSnSe and CuZnSnS but are not limited thereto.

In an embodiment, the quantum dots may not include cadmium. The quantum dot may include a semiconductor nanocrystal based on the group III-V compound including indium and phosphorus. The group III-V compound may further include zinc. The quantum dot may include a semiconductor nanocrystal based on the group II-VI compound including a chalcogen (e.g., sulfur, selenium, tellurium, or a combination thereof) and zinc.

Regarding the quantum dot, the above-described binary compound, the tertiary compound, and/or the quaternary compound may exist in the particles with uniform concentration or may exist in the same particles with a concentration distribution partially divided into some states. Further, the color conversion media layer may have a core/shell structure where one quantum dot surrounds another quantum dot. An interface between the core and the shell may have a concentration gradient such that a concentration of an element existing in the shell is gradually reduced nearing the center thereof.

In some embodiments, the quantum dot may have a core-shell structure including a core including the above-described nanocrystal and a shell surrounding the core. The shell of the quantum dot may act as a protective layer for maintaining the semiconductor characteristic by preventing chemical denaturation of the core and/or a charging layer for providing an electrophoretic characteristic to the quantum dot. The shell may be a single layer or a multilayer. An interface between the core and the shell may have a concentration gradient such that a concentration of an element existing in the shell is gradually reduced nearing the center thereof. Examples of the shell of the quantum dot include a metallic or non-metallic oxide, a semiconductor compound, or a combination thereof.

For example, the metallic or non-metallic oxide may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or tertiary compounds, such as $MgAl_2O_4$, $CoFe_2O_4$, $NiFe_2O_4$, $CoMn_2O_4$, but the present disclosure is not limited thereto.

The semiconductor compound may exemplify CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the present disclosure is not limited thereto.

An interface between the core and the shell may have a concentration gradient such that a concentration of an element existing in the shell is gradually reduced nearing the center thereof. The semiconductor nanocrystal may have a structure including one semiconductor nanocrystal core and a multi-layered shell surrounding the semiconductor nanocrystal core. In an embodiment, the multi-layered shell may have two or more layers, for example, two, three, four, five, or more layers. The two adjacent layers of the shell may have a single composition or different compositions. In the multi-layered shell, each layer may have a composition that varies along the radius.

The quantum dot may have a full width at half maximum (FWHM) of a light-emitting wavelength spectrum that is less than about 45 nm, less than about 40 nm, or less than about 30 nm, and it may improve color purity or color reproducibility within this range. Further, light emitted through the quantum dot is output in all directions, thereby improving a light viewing angle.

Regarding the quantum dot, a shell material and a core material may have different energy bandgaps. For example, the energy bandgap of the shell material may be greater than that of the core material. In another embodiment, the energy bandgap of the shell material may be less than that of the core material. The quantum dot may have a multi-layered shell. Regarding the multi-layered shell, the energy bandgap of an outer layer may be greater than the energy bandgap of an inner layer (e.g., a layer that is near the core). Regarding the multi-layered shell, the energy bandgap of the outer layer may be less than the energy bandgap of the inner layer.

The absorption/emission wavelength of the quantum dot may be adjusted by adjusting the composition and the size thereof. The maximally emitted peak wavelength of the quantum dot may have a wavelength range from ultraviolet to infrared or higher.

The quantum dot may include an organic ligand (e.g., having a hydrophobic residue and/or a hydrophilic residue). The organic ligand residue may be combined to the surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof. Here, R may independently be a C3 to C40 substituted or unsubstituted aliphatic hydrocarbon group, such as a C3 to C40 (e.g., C5 to C24) substituted or unsubstituted alkyl group, or a substituted or unsubstituted alkenyl group, a C6 to C40 (e.g., C6 to C20) substituted or unsubstituted aromatic hydrocarbon group, such as a C6 to C40 substituted or unsubstituted aryl group, or a combination thereof.

Examples of the organic ligand may include thiol compounds, such as methane thiol, ethane thiol, propane thiol, butane thiol, pentane thiol, hexane thiol, octane thiol, dodecane thiol, hexadecane thiol, octadecane thiol, or benzyl thiol; amines, such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropylamine, tributylamine, or trioctylamine; carboxylic acid compounds, such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctylphosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctylphosphine oxide; diphenyl phosphine; a triphenyl phosphine compound or oxide compounds thereof; C5 to C20 alkyl phosphinic acids, such as hexyl phosphinic acid, octyl phosphinic acid, dodecane phosphinic acid, tetradecane phosphinic acid, hexadecane phosphinic acid, or octadecane phosphinic acid; and C5 to C20 alkyl phosphonic acids, but are not limited thereto. The quantum dot may include the organic ligand alone or as a mixture of at least one type. The hydrophobic organic ligand may not include a photopolymerizable residue (e.g., an acrylate group or a methacrylate group).

A second capping layer 280 may be positioned on the transmitting layer 520a, the first color converting layer 520b, the second color converting layer 520c, and the partition wall 265. The second capping layer 280 may be positioned on the spacer 269. The second capping layer 280 may be positioned on the second substrate 210. The second capping layer 280 covers the transmitting layer 520a, the first color converting layer 520b, and the second color converting layer 520c to protect the same and may be made of an inorganic material. For example, the second capping layer 280 may include an inorganic insulating material, such as a silicon nitride ($SiN_x$), a silicon oxide ($SiO_x$), or a silicon oxynitride ($SiO_xN_y$). The second capping layer 280 may be a single-layered or multi-layered structure of the material.

When the display panel 1000 is bonded to the color converting panel 2000, a filling layer 290 may be positioned between the display panel 1000 and the color converting panel 2000. The filling layer 290 may be generally positioned in a plan view.

As shown in FIG. 4, the display device includes the display panel 1000 and the color converting panel 2000 overlapping each other. The filling layer 290 may be positioned between the display panel 1000 and the color converting panel 2000.

A stacking structure of the display panel 1000 in the peripheral area PA of the display device according to an embodiment will now be described.

The display panel 1000 may include the first substrate 110, a driver 501 positioned on one side of the first substrate 110, and the encapsulation layer 400 positioned on the first substrate 110 and the driver 501.

The driver 501 may supply signals for driving a plurality of pixels positioned in the display area DA. A voltage transmitting line for receiving a voltage from the driver 501 and transmitting the same to the signal line positioned in the display area DA may be positioned on the first substrate 110. The driver 501 and the voltage transmitting line may include a transistor positioned in the display area DA, a metal layer for configuring the pixel electrode, and layers positioned on the same layer as the semiconductor layer. Insulating layers may be positioned from among the layers for configuring the driver 501 and the voltage transmitting line, and the insulating layers may be positioned on the same layer as the gate insulating layer 120, the first interlayer insulating layer 160, and the second interlayer insulating layer 180 in the display area DA. For example, elements positioned in the peripheral area PA may be formed in the process of forming elements positioned in the display area DA.

The encapsulation layer 400 may be positioned in most of the region on the first substrate 110. The encapsulation layer 400 may be positioned to (e.g., may extend into) the peripheral area PA from the display area DA. The encapsulation layer 400 may not be positioned in some region of an edge of the peripheral area PA.

A stacking structure of the color converting panel 2000 in the peripheral area PA of the display device according to an embodiment will now be described.

The color converting panel 2000 includes the second substrate 210 and the first color filter 230a, the second color filter 230b, the third color filter 230c, and the dummy partition wall 265a positioned on one side of the second substrate 210.

The first color filter 230a, the second color filter 230b, and the third color filter 230c may overlap each other in the peripheral area PA. The first color filter 230a may be positioned on one side of the second substrate 210, the second color filter 230b may be positioned on the first color filter 230a, and the third color filter 230c may be positioned on the second color filter 230b. The second color filter 230b may be positioned between the first color filter 230a and the third color filter 230c. A stacking order of the first color filter 230a, the second color filter 230b, and the third color filter 230c is not limited thereto, and it may be varied in many ways.

At least one of the first color filter 230a, the second color filter 230b, and the third color filter 230c may have openings 235a, 235b, and 235c positioned in the peripheral area PA. The first opening 235a may be formed in the first color filter 230a, the second opening 235b may be formed in the second color filter 230b, and the third opening 235c may be formed in the third color filter 230c. The first opening 235a, the second opening 235b, and the third opening 235c may have different widths (or diameters). A width Th1 of the first opening 235a may be less than a width Th2 of the second opening 235b, and the width Th2 of the second opening 235b may be less than a width Th3 of the third opening 235c. The widths may gradually increase in order of the first opening 235a, the second opening 235b, and the third opening 235c. At least part of the first opening 235a, the second opening 235b, and the third opening 235c may overlap each other. The entire first opening 235a may overlap the second opening 235b, and the entire second opening 235b may overlap the third opening 235c. Therefore, the first color filter 230a, the second color filter 230b, and the third color filter 230c may be formed in a stair shape in the openings 235a, 235b, and 235c.

The wavelengths of light that the first color filter 230a, the second color filter 230b, and the third color filter 230c transmit may be different. The first color filter 230a including the narrowest first opening 235a may select the color with a relatively high light blocking rate. The third color filter 230c including the widest third opening 235c may select the color with a relatively low light blocking rate.

The widths of the first opening 235a, the second opening 235b, and the third opening 235c are modifiable in many ways. For example, the first opening 235a may have the greatest width, and the third opening 235c may have the smallest width. They are changeable in various ways.

A first capping layer 250 may be positioned on one side of each of the first color filter 230a, the second color filter 230b, and the third color filter 230c. The first capping layer 250 may be generally positioned in the display area DA and the peripheral area PA.

The dummy partition wall 265a may overlap the first color filter 230a, the second color filter 230b, and the third color filter 230c. The dummy partition wall 265a may overlap the color filters 230a, 230b, and 230c in a perpendicular direction to the second substrate 210. The dummy partition wall 265a may overlap the first opening 235a, the second opening 235b, and the third opening 235c. The dummy partition wall 265a may be positioned in the first opening 235a, the second opening 235b, and the third opening 235c and may fill the first opening 235a, the second opening 235b, and the third opening 235c. For example, the dummy partition wall 265a may cover the first opening 235a, the second opening 235b, and the third opening 235c. However, without being limited thereto, the dummy partition wall 265a may cover part of the openings 235a, 235b, and 235c.

The dummy partition wall 265a overlaps the openings 235a, 235b, and 235c such that a height of the dummy partition wall 265a may be different according to the positions. A height of a portion of the dummy partition wall 265a overlapping the openings 235a, 235b, and 235c may be less than a height of a portion of the dummy partition wall 265a not overlapping (e.g., offset from) the openings 235a, 235b, and 235c. The height of the dummy partition wall 265a represents a distance to a side that faces the first substrate 110 of the dummy partition wall 265a from the second substrate 210. A height of a portion of the dummy partition wall 265a provided near the sealing member 601 may be less than a height of a portion of the dummy partition wall 265a provided near the display area DA. Referring to FIG. 4, a left end represents a portion provided near the display area DA, and a right end is an external edge of the peripheral area PA.

The dummy partition wall 265a may be concurrently (or simultaneously) formed in the same process as the partition wall 265. Therefore, the dummy partition wall 265a may be positioned on the same layer as the partition wall 265 and may include the same material.

A dummy spacer 269a may be positioned on the dummy partition wall 265a. The dummy spacer 269a may include the same material as the dummy partition wall 265a. However, without being limited thereto, the dummy spacer 269a may be made of a material that is different from that of the dummy partition wall 265a. The dummy spacer 269a may include a light blocking material. For example, the dummy spacer 269a may include a black pigment.

The dummy spacer 269a may be concurrently (or simultaneously) formed in the same process as the spacer 269. Hence, the dummy spacer 269a may be positioned on the same layer as the spacer 269 and may include the same material.

A second capping layer 280 may be positioned on the dummy partition wall 265. The second capping layer 280 may also be positioned on the dummy spacer 269a. The second capping layer 280 may be generally positioned in the display area DA and the peripheral area PA. The second capping layer 280 may be positioned on the first capping layer 250 at the edge of the display device.

When the display panel 1000 is bonded to the color converting panel 2000, a filling layer 290 and a sealing member 601 may be positioned between the display panel 1000 and the color converting panel 2000.

The filling layer 290 may be generally positioned in a plan view. The filling layer 290 may be positioned in the display area DA and the peripheral area PA. When a material for forming the filling layer is positioned between the display panel 1000 and the color converting panel 2000 and a bonding process is performed in the process for forming the filling layer 290, the material for forming the filling layer may be spread to the edge of the display device. Therefore, the filling layer 290 may be positioned in most of the entire region of the display device. The filling layer 290 may not overlap the sealing member 601.

The sealing member 601 may be positioned on the external edge of the peripheral area PA of the display device. The sealing member 601 may surround the display area DA in a plan view. Therefore, the elements positioned in the display area DA may be surrounded by the sealing member 601 and may be sealed. The display panel 1000 and the color converting panel 2000 may be bonded and fixed by the sealing member 601. The sealing member 601 may be formed by applying a material for forming a sealing member to the external edge of the peripheral area PA between the first substrate 110 and the second substrate 210 and irradiating UV rays to cure the same.

The color filters 230a, 230b, and 230c may be formed up to the external edge of the peripheral area PA of the display device. The dummy partition wall 265a may not be formed up to the external edge of the peripheral area PA of the display device. Therefore, the sealing member 601 may overlap the color filters 230a, 230b, and 230c and may not overlap the dummy partition wall 265a. The sealing member 601 may overlap the first capping layer 250 and the second capping layer 280.

The sealing member 601 and the dummy partition wall 265a may have similar thicknesses. For example, the thickness of the sealing member 601 may be about 11 μm, and the thickness of the dummy partition wall 265a may be about 10 μm. Therefore, when the process for bonding the display panel 1000 and the color converting panel 2000 is performed and the encapsulation layer 400 contacts the dummy partition wall 265a on the edge of the display device, the encapsulation layer 400 and/or the dummy partition wall 265a may be pressed. Accordingly, when the encapsulation layer 400 is broken or torn, gas discharged from the filler may move along the damaged portion, and the light-emitting device positioned below the encapsulation layer 400 may be damaged. Regarding the display device according to an embodiment, the height of the dummy partition wall 265a may be reduced by forming openings 235a, 235b, and 235c in the color filters 230a, 230b, and 230c positioned on the edge of the peripheral area PA and by positioning the dummy partition wall 265a in the openings 235a, 235b, and 235c. Because the height of the dummy partition wall 265a positioned on the edge of the peripheral area PA is relatively low, the encapsulation layer 400 and the dummy partition wall 265a are not pressed in the process for bonding the display panel 1000 and the color converting panel 2000, and the light-emitting device is not damaged.

In some embodiments, a dummy low-refractive index layer may be further positioned in the peripheral area PA of the display device. The dummy low-refractive index layer may overlap the first color filter 230a, the second color filter 230b, and the third color filter 230c and may cover the first opening 235a, the second opening 235b, and the third opening 235c. The dummy low-refractive index layer may be concurrently (or simultaneously) formed in the same process as the low-refractive index layer 240. The dummy low-refractive index layer and the dummy partition wall 265a may be formed, or one of the dummy low-refractive index layer and the dummy partition wall 265a may be formed.

A display device according to an embodiment will now be described with reference to FIG. 5.

The display device described with reference to FIG. 5 mostly corresponds to the display device described with reference to FIG. 1 to FIG. 4, and the portion(s) will not be described again. The first opening is not formed in the present embodiment, which is different from the above-described embodiment.

Figure 5:
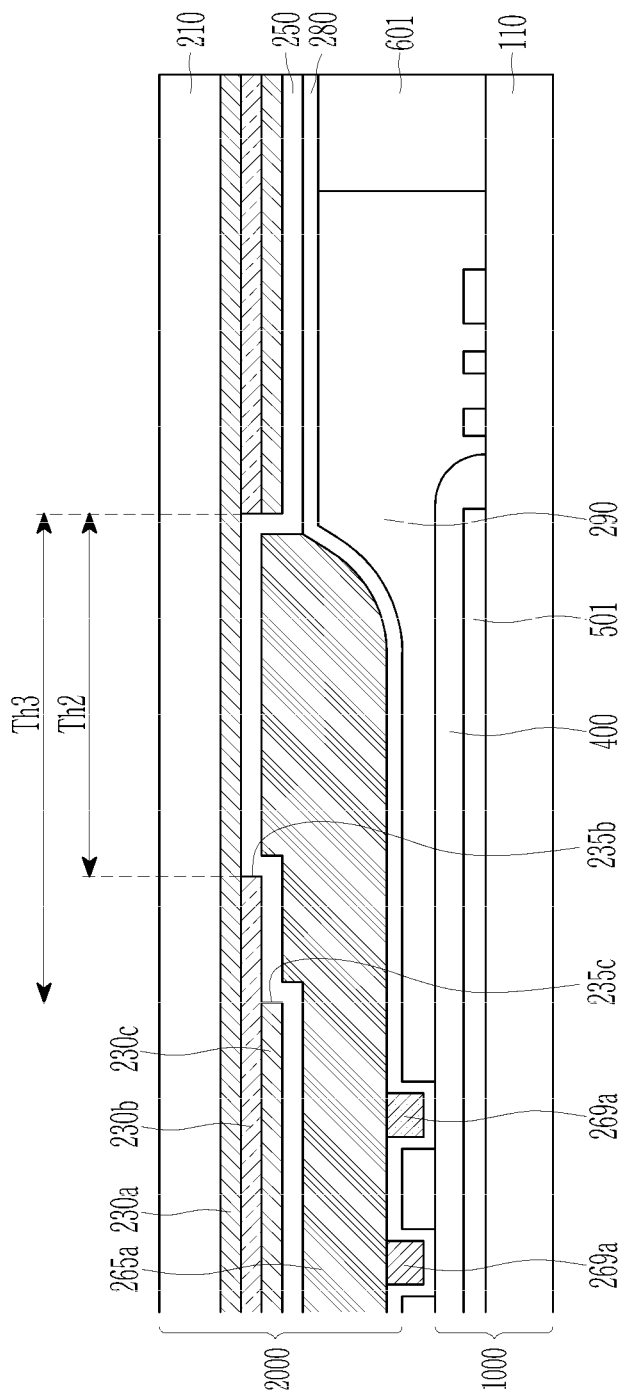
FIG. 5 shows a cross-sectional view of a peripheral area of a display device according to an embodiment.

FIG. 5 shows a cross-sectional view of a peripheral area of a display device according to an embodiment.

Similar to the above-described embodiment, the display device according to an embodiment includes a display panel 1000, a color converting panel 2000, and a sealing member 601 positioned between the display panel 1000 and the color converting panel 2000 and positioned on the external edge of the peripheral area. The display panel 1000 may include a first substrate 110, a plurality of light-emitting devices positioned on one side of the first substrate 110, and an encapsulation layer 400 positioned on a plurality of light-emitting devices and positioned in the display area and the peripheral area. The color converting panel 2000 may include a second substrate 210 and a first color filter 230a, a second color filter 230b, a third color filter 230c, a partition wall, and a dummy partition wall 265a positioned on one side of the second substrate 210. The light-emitting device and the partition wall are positioned in the display area, which is not shown in FIG. 5.

At least one of the first color filter 230a, the second color filter 230b, and the third color filter 230c may have openings 235b and 235c positioned in the peripheral area, and the dummy partition wall 265a may overlap the openings 235b and 235c. Openings may be formed in the first color filter 230a, the second color filter 230b, and the third color filter 230c as in the previously-described embodiment, and the opening may not be formed in the first color filter 230a in the present embodiment. In the present embodiment, the second opening 235b may be formed in the second color filter 230b, and the third opening 235c may be formed in the third color filter 230c. The second opening 235b and the third opening 235c may have different widths. The width Th2 of the second opening 235b may be less than the width Th3 of the third opening 235c. At least part of the second opening 235b and the third opening 235c may overlap each other. Therefore, the first color filter 230a, the second color filter 230b, and the third color filter 230c may have a stair shape in the openings 235b and 235c.

The dummy partition wall 265a may overlap the first color filter 230a, the second color filter 230b, and the third color filter 230c. The dummy partition wall 265a may overlap the second opening 235b and the third opening 235c. The dummy partition wall 265a may be positioned in the second opening 235b and the third opening 235c and may fill the second opening 235b and the third opening 235c.

As the dummy partition wall 265a overlaps the openings 235b and 235c, the height of the dummy partition wall 265a may be different depending on the position. The height of the portion of the dummy partition wall 265a provided near the sealing member 601 may be less than the height of the portion of the dummy partition wall 265a provided near the display area. Because the height of the dummy partition wall 265a positioned on the edge of the peripheral area is relatively low, the encapsulation layer 400 and the dummy partition wall 265a are not pressed in the process for bonding the display panel 1000 and the color converting panel 2000, and the light-emitting device is not damaged.

A display device according to an embodiment will now be described with reference to FIG. 6.

The display device according to an embodiment described with reference to FIG. 6 mostly corresponds to the display device according to the embodiment described above with reference to FIG. 1 to FIG. 4, and the same portion(s) will not be described again. The first opening and the second opening are not formed in the present embodiment, which is different from the above-described embodiment.

Figure 6:
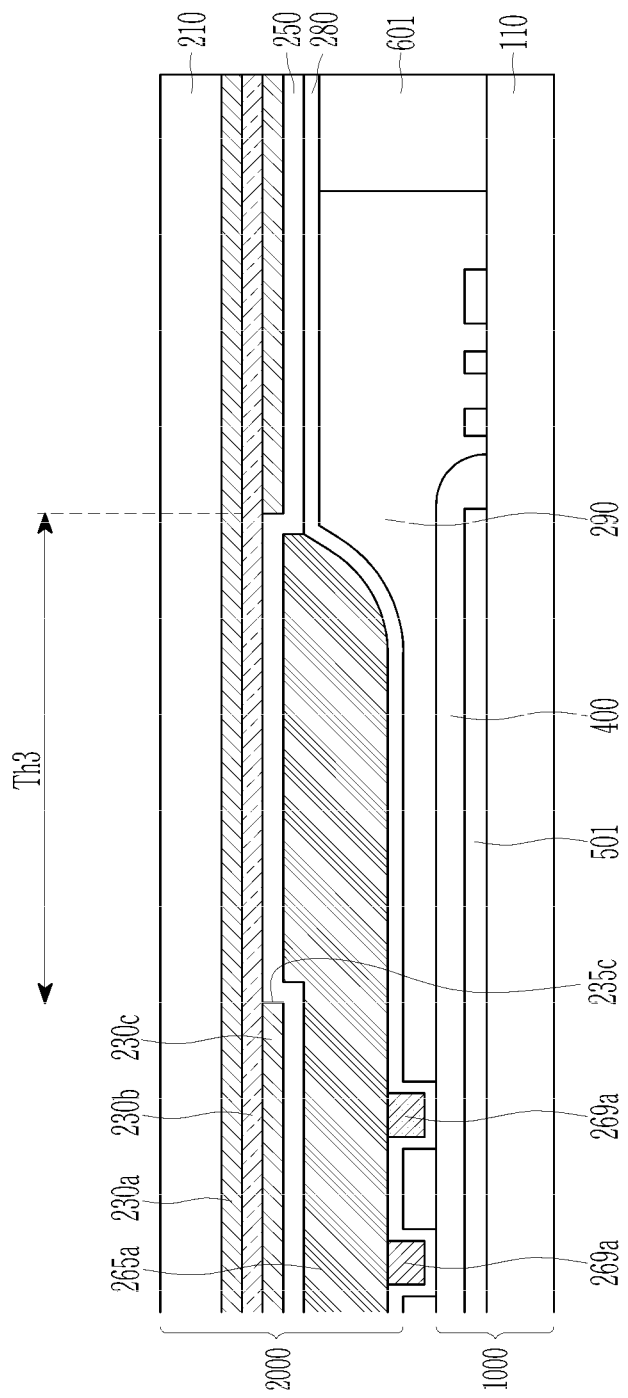
FIG. 6 shows a cross-sectional view of a peripheral area of a display device according to an embodiment.

FIG. 6 shows a cross-sectional view of a peripheral area of a display device according to an embodiment.

Similar to the above-described embodiment, the display device according to an embodiment includes a display panel 1000, a color converting panel 2000, and a sealing member 601 positioned between the display panel 1000 and the color converting panel 2000 and positioned on the external edge of the peripheral area. The display panel 1000 may include a first substrate 110, a plurality of light-emitting devices positioned on one side of the first substrate 110, and an encapsulation layer 400 positioned on a plurality of light-emitting devices and positioned in the display area and the peripheral area. The color converting panel 2000 may include a second substrate 210, and a first color filter 230a, a second color filter 230b, a third color filter 230c, a partition wall, and a dummy partition wall 265a positioned on one side of the second substrate 210. The light-emitting device and the partition wall are positioned in the display area.

Openings may be formed in the first color filter 230a, the second color filter 230b, and the third color filter 230c in the previously-described embodiment, and the openings may not be formed in the first color filter 230a and the second color filter 230b in the present embodiment. The third opening 235c may be formed in the third color filter 230c in the present embodiment. The width Th3 of the third opening 235c may be adjusted in an appropriate way. The first color filter 230a, the second color filter 230b, and the third color filter 230c may be formed in a stair shape in the openings 235b and 235c.

The dummy partition wall 265a may overlap the first color filter 230a, the second color filter 230b, and the third color filter 230c. The dummy partition wall 265a may overlap the third opening 235c. The dummy partition wall 265a may be positioned in the third opening 235c and may fill the third opening 235c.

Because the dummy partition wall 265a overlaps the third opening 235c, the height of the dummy partition wall 265a may be different according to the position. The height of the portion of the dummy partition wall 265a provided near the sealing member 601 may be less than the height of the portion of the dummy partition wall 265a provided near the display area. Because the height of the dummy partition wall 265a positioned on the edge of the peripheral area is relatively low, the encapsulation layer 400 and the dummy partition wall 265a are not pressed in the process for bonding the display panel 1000 and the color converting panel 2000, and the light-emitting device is not damaged.

A display device according to an embodiment will now be described with reference to FIG. 7.

The display device according to an embodiment described with reference to FIG. 7 mostly corresponds to the display device according to the embodiment described above with reference to FIG. 1 to FIG. 4, and the same portion(s) will not be described. The dummy spacer overlaps the opening in the present embodiment, which is different from the above-described embodiment, which will now be described in detail.

Figure 7:
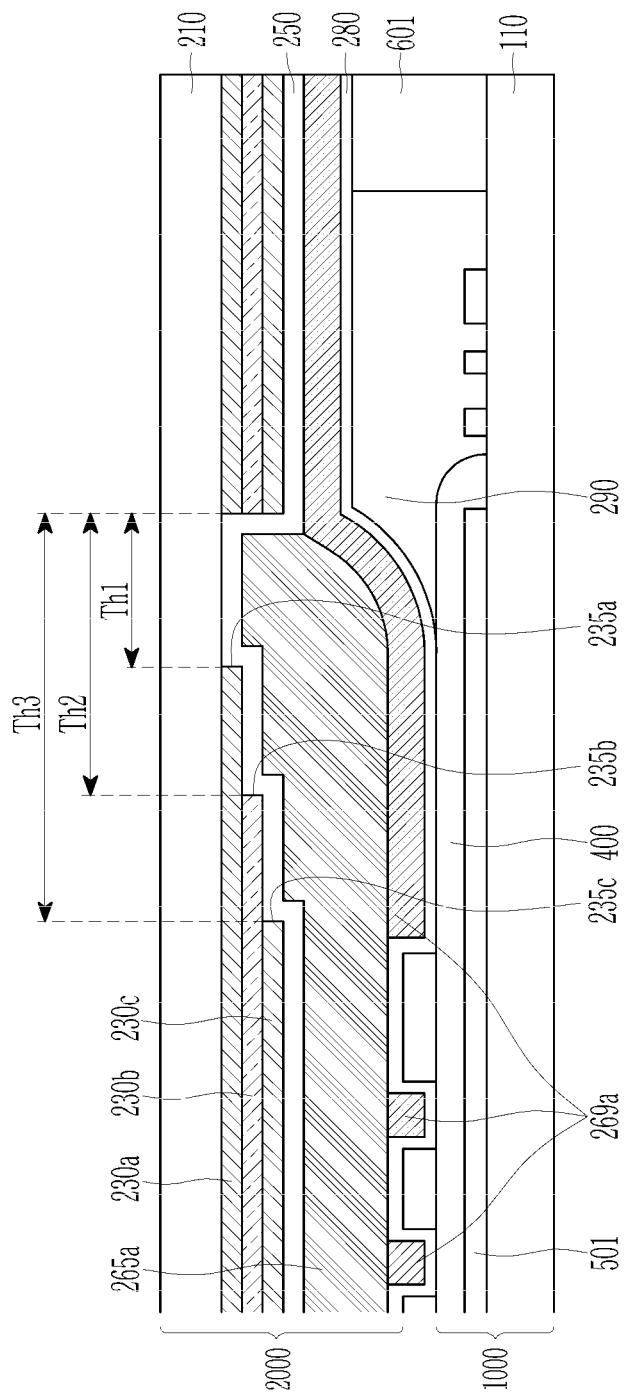
FIG. 7 shows a cross-sectional view of a peripheral area of a display device according to an embodiment.

FIG. 7 shows a cross-sectional view of a peripheral area of a display device according to an embodiment.

Similar to the above-described embodiment, the display device according to an embodiment includes a display panel 1000, a color converting panel 2000, and a sealing member 601 positioned between the display panel 1000 and the color converting panel 2000 and positioned on the external edge of the peripheral area. The display panel 1000 may include a first substrate 110, a plurality of light-emitting devices positioned on one side of the first substrate 110, and an encapsulation layer 400 positioned on a plurality of light-emitting devices and positioned in the display area and the peripheral area. The color converting panel 2000 may include a second substrate 210 and a first color filter 230a, a second color filter 230b, a third color filter 230c, a partition wall, and a dummy partition wall 265a positioned on one side of the second substrate 210. The light-emitting device and the partition wall are positioned in the display area.

A dummy spacer 268a may be positioned on the dummy partition wall 265a. The dummy spacer 269a may not overlap the openings 235a, 235b, and 235c as in the previously-described embodiment, and the dummy spacer 269a may overlap the openings 235a, 235b, and 235c in the present embodiment. The dummy spacer 269a may overlap the sealing member 601. However, without being limited thereto, the dummy spacer 269a may not overlap (e.g., may be offset from) the sealing member 601.

The dummy spacer 269a may include a light blocking material. For example, the dummy spacer 269a may include a black pigment. The dummy spacer 269a including the light blocking material overlaps the openings 235a, 235b, and 235c, thereby preventing light from leaking at the portion where the openings 235a, 235b, and 235c are formed in the color filters 230a, 230b, and 230c.

While the present disclosure has been described in connection with what is presently considered to be practical embodiments, it is to be understood that the present disclosure is not limited to the embodiments described herein, but is intended to cover various modifications and equivalent arrangements included within the spirit and scope of the appended claims and their equivalents.

DESCRIPTION OF SOME REFERENCE SYMBOLS

110: first substrate
210: second substrate
230a: first color filter
230b: second color filter
230c: third color filter
235a: first opening
235b: second opening
235c: third opening
290: filling layer
400: encapsulation layer
1000: display panel
2000: color converting panel
ED: light-emitting device

What is claimed is:

1. A display device comprising:
a display panel and a color converting panel facing each other and having a display area and a peripheral area; and
a sealing member between the display panel and the color converting panel, the sealing member being at an external edge of the peripheral area,
wherein the display panel comprises:
a first substrate;
a plurality of light-emitting devices on one side of the first substrate and in the display area; and
an encapsulation layer on the light-emitting devices and in the display area and the peripheral area,
wherein the color converting panel comprises:
a second substrate;
a first color filter, a second color filter, and a third color filter on one side of the second substrate and in the display area and the peripheral area; and
a partition wall in the display area, and a dummy partition wall in the peripheral area, the dummy partition wall being in a same layer as the partition wall and on the first color filter, the second color filter, and the third color filter,
wherein the peripheral area is between outermost ones of the light-emitting devices from among the plurality of light-emitting devices and an edge of the first substrate,
wherein a first portion of each of the first color filter, the second color filter, and the third color filter overlap each other in the peripheral area,
wherein at least two of the first color filter, the second color filter, and the third color filter have openings having different widths and overlap each other in the peripheral area, and
wherein the dummy partition wall overlaps the openings and is interposed between the encapsulation layer and the openings.

2. The display device of claim 1, wherein the partition wall is in the display area, and
wherein the dummy partition wall is in the peripheral area.

3. The display device of claim 2, wherein the partition wall overlaps the first color filter, the second color filter, and the third color filter in the display area, and
wherein the dummy partition wall overlaps the first color filter, the second color filter, and the third color filter in the peripheral area.

4. The display device of claim 1, wherein the openings comprise:
a first opening in the first color filter;
a second opening in the second color filter; and
a third opening in the third color filter.

5. The display device of claim 4, wherein the first opening, the second opening, and the third opening have different widths from each other.

6. The display device of claim 4, wherein at least a portion of each of the first opening, the second opening, and the third opening overlap each other.

7. The display device of claim 4, wherein the first color filter, the second color filter, and the third color filter have a stair shape in the openings.

8. The display device of claim 1, wherein the openings comprise:
a second opening in the second color filter; and
a third opening in the third color filter, and
wherein an opening is not in the first color filter in the peripheral area.

9. The display device of claim 1, wherein a height of a portion of the dummy partition wall overlapping the openings is less than a height of a portion of the dummy partition wall offset from the openings.

10. The display device of claim 1, wherein a height of a portion of the dummy partition wall nearer to the sealing member is less than a height of a portion of the dummy partition wall nearer to the display area.

11. The display device of claim 1, further comprising a spacer on the partition wall.

12. The display device of claim 11, further comprising a dummy spacer on the dummy partition wall.

13. The display device of claim 12, wherein the dummy spacer comprises a light blocking material and overlaps the openings.

14. The display device of claim 1, further comprising a first color converting layer, a second color converting layer, and a transmitting layer surrounded by the partition wall in a plan view and in the display area,
wherein the first color converting layer overlaps the first color filter,
wherein the second color converting layer overlaps the second color filter, and
wherein the transmitting layer overlaps the third color filter.

15. The display device of claim 1, wherein the dummy partition wall is in the openings.

16. The display device of claim 15, wherein the dummy partition wall fills the openings.

17. A color converting panel comprising:
a second substrate having a display area and a peripheral area, the peripheral area being between a side of the display area and an edge of the second substrate;
a first color filter, a second color filter, and a third color filter on one side of the second substrate and in the peripheral area, a first portion of each of the first color filter, the second color filter, and the third color filter overlapping each other in the peripheral area; and
a partition wall on the first color filter, the second color filter, and the third color filter,
wherein at least two of the first color filter, the second color filter, and the third color filter have external openings extending through an entire thickness of the at least two of the first color filter, second color filter, and third color filter having different widths and overlap each other in the peripheral area, and
wherein the partition wall has a first surface, and a second surface opposing the first surface and being farther from the second substrate than the first surface,
wherein the second surface of the partition wall is depressed toward the second substrate in a region overlapping the external openings.

18. The color converting panel of claim 17, wherein the first color filter, the second color filter, and the third color filter are patterned, and
wherein the first color filter, the second color filter, and the third color filter do not overlap each other in the display area.

19. The color converting panel of claim 18, further comprising a color converting layer overlapping non-overlapping portions of the first color filter, the second color filter, and the third color filter and are between the partition wall.

* * * * *